United States Patent Office 3,594,144

Patented July 20, 1971

3,594,144

DISPERSING VEHICLE USED IN GLASS BONDING

Salvatore J. Acello, North Adams, Mass., assignor to Sprague Electric Company, North Adams, Mass.

No Drawing. Filed Oct. 10, 1968, Ser. No. 766,639
Int. Cl. C03c 27/00
U.S. Cl. 65—43 2 Claims

ABSTRACT OF THE DISCLOSURE

The assembly of parts of an integrated assembly by a bond between the parts is achieved by the application of a composition which is solder glasses, ceramics, or metals in fine powder form which are dispersed in fluorinated ether vehicle. The vehicle is removed and the parts bonded by fusion.

BACKGROUND OF THE INVENTION

The present invention relates to a composiaion wherein fluorinated ether is utilized as a dispersing vehicle for powdered glasses, ceramics metals and the like. A method is also provided for utilizing the dispersion.

Integrated circuit assembly techniques are of critical importance to both manufacturers and the ultimate users of the circuit assemblies. Usually, after the wafer of integrated components or circuits is completely processed, it is necessary to perform additional assembly steps to protect the unit and also to form it into a useful configuration. It is therefore necessary to assemble the unit into a package for protection purposes and further to bring the contacts out in a form suitable for equipment application. Such assembly requires bonding metallic and nonmetallic subassemblies into standard configuration packages.

A common prior art technique is to use low temperature solder glasses having a coefficient of thermal expansion which closely matches those of the package to which the subassemblies are to be bonded. The solder glass, usually in powder form and suspended in a liquid vehicle is applied between the subassemblies and the solder glass then heated to effect the desired bond. However, low temperature solder glasses contain heavy metal oxides which are easily reduced, thereby causing discoloration and malfunction of the overall circuit package. The heretofore available dispersing mediums have the undesirable property of pyrolysing breaking down to yield a reducing atmosphere.

In the production of thick film circuits, such as resistor circuits for example, metal or ceramic or glass powders are required to be suspended in liquid vehicles to facilitate their application onto passive substrates of ceramic or glass. The thick films are generally more than $10^4$ angstroms thick, and silk screening techniques are often used to produce the film pattern on the desired substrate. Silk screening requires simple masks and a minimum of relatively inexpensive equipment. However, the deposition of the material is not easily controlled, and with existing suspension mediums subsequent processing is usually required to meet deired specifications. In this regard, part of the deposited metal must be cut away by sandblasting, microengraving, photolithography or electric pulsing, for example, to increase the resistance to the specified value.

Accordingly, it is an object of the present invention to provide a dispersing vehicle for fine powders which avoids the above disadvantages and which functions in a highly beneficial and unexpected manner to facilitate the fine-line application of these powders. Another objectis the provision of a method for utilizing the dispersing vehicle.

DETAILED DESCRIPTION OF THE INVENTION

More particularly, the present invention involves the use of Freon E Series fluorinated ethers as dispersing vehicles for powdered material, such as solder glasses, ceramics, and heavy metals. Freon E Series fluorinated ethers are manufactured and sold by E. I. du Pont de Nemours & Company and have the following chemical structure:

$$F(\underset{\displaystyle CF_3}{\underset{|}{C}}FCF_2O)_nCHFCF_3$$

The E number is equal to *n*. These ethers provide low room temperature drying rates with high evaporation rates at elevated temperatures. They are relatively thin liquids having a range of viscosities from about 0.5 to 7.0 centipoise at 77° F. In addition to complete evaporation with no residue, Freon E fluorocarbon mediums disperse glass, ceramic, and metal powders in a completely unexpected manner which facilitates fine-line application of these powders.

Prior to the actual bonding of integrated subassemblies into package form, solder glass in fine powder form is mixed with one of the above described suspending mediums. When so mixed the resulting mixture is extremely thixotropic having a consistency similar to "whipped cream." It is believed an interfacial phenomenon brings about the "whipped cream" consistency and that extremely low surface tension permits the Freon E Series fluorinated ethers to enter between the particles of glass to provide the desired suspendibility. The paste-like mixture can then be applied between the various circuit subassemblies to be bonded. The subsequent application of heat drives off the ether and melts the solder glass to produce the desired bond. No reducing atmosphere is produced and the application of the solder glass powder is easily accomplished with a high degree of accuracy.

More specifically, the solder glasses may consist of commercially available alkali-free glasses. Illustrative of essentially alkali-free glass that can be used for the purpose of this invention are the glasses selected from the group consisting of a glass of 10 to 15 weight percent $SiO_2$, 0 to 0.05 weight percent $Al_2O_3$, 15 to 18 weight percent PbO, 15 to 20 weight percent $B_2O_3O$, 38 to 45 weight percent Zn and 9 to 12 weight percent CuO; a glass consisting of 2 to 4 weight percent $SiO_2$, 2 to 4 weight percent $Al_2O_3$, 60 to 65 weight percent PbO, 15 to 20 weight percent $B_2O_3$, 7 to 10 weight percent ZnO, 2 to 3 weight precent BaO and 2 to 3 weight percent CuO; a glass composition consisting of 2 to 3 weight percent SiO, 70 to 75 weight percent PbO, 10 to 12 weight percent $B_2O_3$, 15 to 18 weight percent ZnO and 0.5 to 2 weight percent $SnO_2$; and a glass composition containing 1 to 3 weight percent $SiO_2$, 74 to 78 weight percent PbO, 7 to 10 weight percent $B_2O_3$ and 11 to 13 weight percent ZnO. Preferably, the particle size of the glass is less than 150 microns, with no more than 10 percent of the particles as large as 150 microns. Specifically, with glass particles less than 50 microns in size extremely satisfactory results are obtained.

The procedure for bonding integrated subassemblies into package form is accomplished in the following manner. First, one of the Freon E Series fluorinated ethers is mixed with one of the above powdered solder glasses until the desired "whipped cream" viscosity is obtained. The resulting paste is then applied in suitable quantity to the desired location in the package and the package positioned for heating to a temperature that causes the glass to melt. As the package parts are heated the dispersing vehicle rapidly evaporates at about 380° F. leaving the glass powder which subsequently melts at about 370° to 450° C. to cause the bond. Alternatively, depending upon the particular package being produced, the subassemblies to be bonded may be placed in their package positions after the suspending medium is driven off and the glass melts.

Additionally, the Freon E Series fluorocarbons function equally well as dispersing vehicles for conductive heavy metal powders. For example, with fine silver powder dispersed in such a fluorocarbon and screened onto an alumina substrate it is possible to obtain line definition equal to or better than commercially available fine-line metal pastes containing resinous or cellulosic organic binders.

Fine ceramic powders are also dispersed in the Freon E Series fluorocarbons for screening as insulation over or between conductive deposits. Ceramics that are suitable for this invention include the titanates and alumina in finely divided form with not more than 10% of the particles greater than 100 microns. The ceramic paste of this invention is deposited by prior art means, such as screening, and then heated to above about 380° F. to evaporate the florocarbon and on up to about 2400° F. to sinter the ceramic particles.

I claim:

1. In the method of assembling parts of integrated subassemblies into a package by bonding one part of the subassembly to another part with solder glass, the steps of preparing a mixture consisting of alkali-free powdered glass selected from the group consisting of a glass composition of $SiO_2$, $Al_2O_3$, PbO, $B_2O_3$, ZnO and CuO; a glass composition of $Al_2O_3$, $SiO_2$, PbO, $B_2O_3$, ZnO, BaO, and CuO; a glass composition of $SiO_2$, PbO, $B_2O_3$, ZnO, and a glass composition of $SiO_2$, PbO, $B_2O_3$ and ZnO having a particle size less than 150 microns and dispersed in a fluorinated ether, mixing the powdered glass and ether to a consistency of a thixotropic suspension, applying said mixture having said consistency to the surface of a subassembly part, heating the applied mixture to a temperature in the range of 370° C. to 450° C. and thereby evaporating the fluorinated ether and melting the glass powder so that the ether separates from the mixture and bonding the melted glass powder to the surface.

2. A method as in claim 1 including the step of positioning the coated subassembly in its package position prior to the heating step.

References Cited

UNITED STATES PATENTS

| | | | |
|---|---|---|---|
| 2,945,327 | 7/1960 | Malm et al. | 65—43 |
| 3,029,559 | 4/1962 | Treplow | 65—43X |
| 3,383,344 | 5/1968 | Gill | 106—49X |

S. LEON BASHORE, Primary Examiner

R. L. LINDSAY, Jr., Assistant Examiner

U.S. Cl. X.R.

65—59, 60; 106—49; 117—124